United States Patent [19]
Fredenburg

[11] Patent Number: 5,845,238
[45] Date of Patent: Dec. 1, 1998

[54] SYSTEM AND METHOD FOR USING A CORRESPONDENCE TABLE TO COMPRESS A PRONUNCIATION GUIDE

[75] Inventor: Timothy Fredenburg, Pacifica, Calif.

[73] Assignee: Apple Computer, Inc., Cupertino, Calif.

[21] Appl. No.: 665,404

[22] Filed: Jun. 18, 1996

[51] Int. Cl.⁶ .............................. G06F 15/40; G06F 13/00; G06F 17/30
[52] U.S. Cl. .................................. 704/1; 707/532; 341/51
[58] Field of Search .................................. 704/1, 10, 201; 707/530, 532; 434/156, 169; 341/50, 51, 55

[56] References Cited

U.S. PATENT DOCUMENTS

| | | | |
|---|---|---|---|
| 4,779,080 | 10/1988 | Coughin et al. | 345/157 |
| 4,876,541 | 10/1989 | Storer | 341/51 |
| 5,189,610 | 2/1993 | Kaplan et al. | 704/1 |
| 5,325,091 | 6/1994 | Kaplan et al. | 341/51 |
| 5,333,313 | 7/1994 | Heising | 707/1 |
| 5,500,920 | 3/1996 | Kupiec | 704/270 |
| 5,523,946 | 6/1996 | Kaplan et al. | 704/2 |
| 5,530,645 | 6/1996 | Chu | 707/532 |
| 5,551,049 | 8/1996 | Kaplan et al. | 707/532 |
| 5,649,221 | 7/1997 | Crawford et al. | 704/4 |
| 5,680,601 | 10/1997 | Rust | 341/50 |

*Primary Examiner*—David R. Hudspeth
*Assistant Examiner*—Patrick N. Edouard
*Attorney, Agent, or Firm*—Carr & Ferrell LLP

[57] ABSTRACT

Parsing routines extract from a conventional pronunciation dictionary an entry, which includes a dictionary word and dictionary phonemes representing the pronunciation of the dictionary word. A correspondence table is used to compress the pronunciation dictionary. The correspondence table includes correspondence sets for a particular language, each set having a correspondence text entry, a correspondence phoneme entry representing the pronunciation of the correspondence text entry and a unique correspondence set identifying symbol. A matching system compares a dictionary entry with the correspondence sets, and replaces the dictionary entry with the symbols representing the best matches. In the absence of a match, symbols representing silent text or unmatched phonemes can be used. The correspondence symbols representing the best matches provide compressed pronunciation dictionary entries. The matching system also generates decoder code sets for subsequently translating the symbol sets. A decoder system uses the decoder code sets for translating symbol sets in the compressed pronunciation dictionary to generate phonemes corresponding to selected text.

33 Claims, 7 Drawing Sheets

FIG. 3: A Correspondence Table for American English  240

| Phoneme(s) | Text Entry | Symbol |
|---|---|---|
| AE | ai | (1) |
| AE | a | (2) |
| EY | ai | (3) |
| EY | ae | (4) |
| EY | ay | (5) |
| EY | a | |
| EY | ey | |
| EY | e | |
| AO | au | |
| AO | a | (10) |
| AO | oa | |
| AO | ou | |
| AO | o | |
| AX k | c | |
| AX l | l | |
| AX m | m | |
| AX | a | |
| AX | e | |
| AX | ia | |
| AX | i | (20) |
| AX | o | |
| AX | u | |
| AX | y | |
| AX | ' | |
| IY IX | u | |
| IY | ae | |
| IY | ea | |
| IY | ee | |
| IY | eo | |
| IY | ey | (30) |
| IY | e | |
| IY | ie | |
| IY | i | |
| IY | oe | |
| IY | y | |
| EH | ae | |
| EH | ai | |
| EH | a | |
| EH | ea | |
| EH | e | (40) |
| EH | u | |
| IH | a | |
| IH | e | |
| IH | i | |
| IH | o | |
| IH | u | |
| IH | y | |
| AY | ae | |
| AY | ai | |
| AY | a | (50) |
| AY | i | |
| AY | y | |
| IX l | le | |
| IX n | n' | |
| IX | ae | |
| IX | a | |
| IX | eou | |
| IX | ea | |

| Phoneme(s) | Text Entry | Symbol |
|---|---|---|
| IX | e | |
| IX | iou | (60) |
| IX | io | |
| IX | ia | |
| IX | i | |
| IX | ou | |
| IX | o | |
| IX | u | |
| IX | y | |
| IX | ' | |
| AA | aa | |
| AA | a | (70) |
| AA | e | |
| AA | ow | |
| AA | o | |
| UW | ew | |
| UW | oo | |
| UW | ou | |
| UW | o | |
| UW | u | |
| UH l | le | |
| UH | e | (80) |
| UH | oo | |
| UH | o | |
| UH | u | |
| UX r | r | |
| UX | a | |
| UX | eu | |
| UX | e | |
| UX | i | |
| UX | ou | |
| UX | o | (90) |
| UX | u | |
| UX | y | |
| OW | au | |
| OW | a | |
| OW | ew | |
| OW | oa | |
| OW | ou | |
| OW | ow | |
| OW | o | |
| AW | ao | (100) |
| AW | au | |
| AW | a | |
| AW | ou | |
| AW | ow | |
| OY | aw | |
| OY | oi | |
| OY | oy | |
| b | bb | |
| b | b | |
| C | ch | (110) |
| C | c | |
| C | s | |
| C | tch | |
| C | t | |
| d | dd | |

| Phoneme(s) | Text Entry | Symbol |
|---|---|---|
| d | d | |
| d | ed | |
| d | tt | |
| d | t | |
| D | th | (120) |
| f | ff | |
| f | f | |
| f | gh | |
| f | ph | |
| g z | x | |
| g Z | x | |
| g | gg | |
| g | gh | |
| g | g | |
| h | h | (130) |
| h | j | |
| h | x | |
| J | dg | |
| J | dj | |
| J | d | |
| J | g | |
| J | j | |
| k w | cqu | |
| k s | x | |
| k S | x | (140) |
| k T | th | |
| k | cc | |
| k | ch | |
| k | ck | |
| k | c | |
| k | k | |
| k | lk | |
| k | qu | |
| k | q | |
| l | ll | (150) |
| l | l | |
| l | sl | |
| m | lm | |
| m | mm | |
| m | m | |
| n y | gn | |
| n | en | |
| n | gn | |
| n | kn | |
| n | nn | (160) |
| n | n | |
| N | ng | |
| N | n | |
| p | pp | |
| p | p | |
| r r | r | |
| r | er | |
| r | rr | |
| r | r | |
| s | c | (170) |
| s | sc | |
| s | ss | |

| Phoneme(s) | Text Entry | Symbol |
|---|---|---|
| s | s | |
| s | z | |
| S | c | |
| S | sh | |
| S | ss | |
| S | s | |
| S | t | |
| t s | z | (180) |
| t | d | |
| t | ed | |
| t | th | |
| t | tt | |
| t | t | |
| T | th | |
| v | f | |
| v | v | |
| w 1 AA | oi | |
| w 1 UX | o | (190) |
| w AA | oi | |
| w UX | o | |
| w | u | |
| w | w | |
| y 1 UH | u | |
| y 1 UW | u | |
| y 1 UW | ew | |
| y 1 UX | u | |
| y UH | u | |
| y UW | ew | (200) |
| y UW | ieu | |
| y UW | u | |
| y UX | u | |
| y IX | u | |
| y AX | a | |
| y AX | u | |
| y AA | o | |
| y | i | |
| y | j | |
| y | ll | (210) |
| y | y | |
| z | es | |
| z | s | |
| z | x | |
| z | z | |
| Z | g | |
| Z | j | |
| Z | ss | |
| Z | s | |
| Z | z | (220) |

Phoneme Set for American English

| Phoneme symbol | Example |
|---|---|
| AE | bat |
| EY | bait |
| AO | caught |
| AX | about |
| IY | beet |
| EH | bet |
| IH | bit |
| AY | bite |
| IX | roses |
| AA | cot |
| UW | boot |
| UH | book |
| OW | boat |
| AW | bout |
| OY | boy |
| b | bin |
| C | chin |
| d | din |
| D | them |
| f | fin |
| g | gain |
| h | hat |
| J | jump |
| k | kin |
| l | limb |
| m | mat |
| n | nat |
| N | tang |
| p | pin |
| r | ran |
| s | sin |
| t | tin |
| T | thin |
| v | van |
| w | wet |
| y | yet |
| z | zen |
| Z | measure |

FIG. 7

SYSTEM AND METHOD FOR USING A CORRESPONDENCE TABLE TO COMPRESS A PRONUNCIATION GUIDE

BACKGROUND OF THE INVENTION

1. Field of the Invention

This invention relates generally to data compression, and more particularly to a system and method using correspondence techniques to compress a pronunciation guide.

2. Description of the Background Art

Computer Random Access Memory (RAM) and disk space are becoming more available and affordable in desktop computer systems. A typical desktop computer system currently provides on the order of sixteen megabytes of RAM and one gigabyte of hard disk memory. This increasing availability allows programmers the freedom to create application programs and data files which occupy several megabytes of computer memory. However, minimizing the size of data files remains important for optimizing system performance and use of memory resources.

To minimize storage requirements, programmers compress large data files. One type of large file is a pronunciation dictionary, which includes dictionary words for a language such as American English and dictionary phonemes (phonetic sounds) representing the pronunciation of each of the dictionary words. A typical uncompressed pronunciation dictionary occupies up to about ten megabytes of memory.

Information such as a pronunciation dictionary can be compressed using certain symbols to replace redundant data. For example, a typical compression technique assigns symbols to represent particular patterns of redundant data such as multiple zeros or ones. Multiple compression techniques may be performed successively to eliminate more redundancies and compress data further. Accordingly, a pronunciation dictionary may be compressed to around thirty percent or less of its original size.

Previous techniques for compressing pronunciation dictionaries do not take into account redundancies inherent in dictionary words and dictionary phonemes. Therefore, as an addition to other techniques for compressing a pronunciation dictionary, it is desirable to have a system and method for taking advantage of redundancies in pronunciation.

SUMMARY OF THE INVENTION

The present invention overcomes limitations and deficiencies of previous systems by providing a new system and method for compressing a pronunciation guide such as a pronunciation dictionary. The system substitutes a single symbol for some text and its pronunciation, and includes a central processing unit (CPU) and memory. The memory stores a compression system including parsing routines, a correspondence table, a matching system, a decoder table and a decoder system. The parsing routines extract a dictionary entry, which comprises a dictionary word and corresponding dictionary phonemes representing the pronunciation of the dictionary word, from an uncompressed pronunciation dictionary also stored in the memory. The correspondence table is made up of correspondence sets, each of which has a text entry, a phoneme entry representing the pronunciation of the text entry, and a set-identifying symbol (i.e., a number). The matching system attempts to find all correspondence sets that match text and phoneme combinations of the dictionary entry.

If matches are found, then the matching engine selects the best matches and adds the representative correspondence symbol set to a compressed pronunciation dictionary. If a match is not found, then the matching system considers characters silent and/or phonemes unmatched, and assigns special symbols to be added to the compressed pronunciation dictionary. The matching system adds decoder code sets to a decoder table for translating the special symbols back to characters or phonemes.

The decoder system uses the compressed pronunciation dictionary and decoder code sets to generate corresponding phonemes for selected text. These phonemes can be used in processes such as speech recognition, speech synthesis, language translation, foreign language learning, spell checking, etc.

The present invention provides a method for compressing a pronunciation dictionary. The method creates a correspondence table comprised of correspondence sets, determines which correspondence sets match a dictionary word and its corresponding dictionary phonemes, and adds the correspondence symbols as compressed data entries to a compressed pronunciation dictionary. The invention also provides a method for using the compressed dictionary and decoder code sets to generate phonemes from input text.

BRIEF DESCRIPTION OF THE DRAWINGS

FIG. 3 is a text-phoneme correspondence table for American English;

FIG. 7 is an example phoneme set for American English.

DETAILED DESCRIPTION OF THE PREFERRED EMBODIMENT

Figure 1:
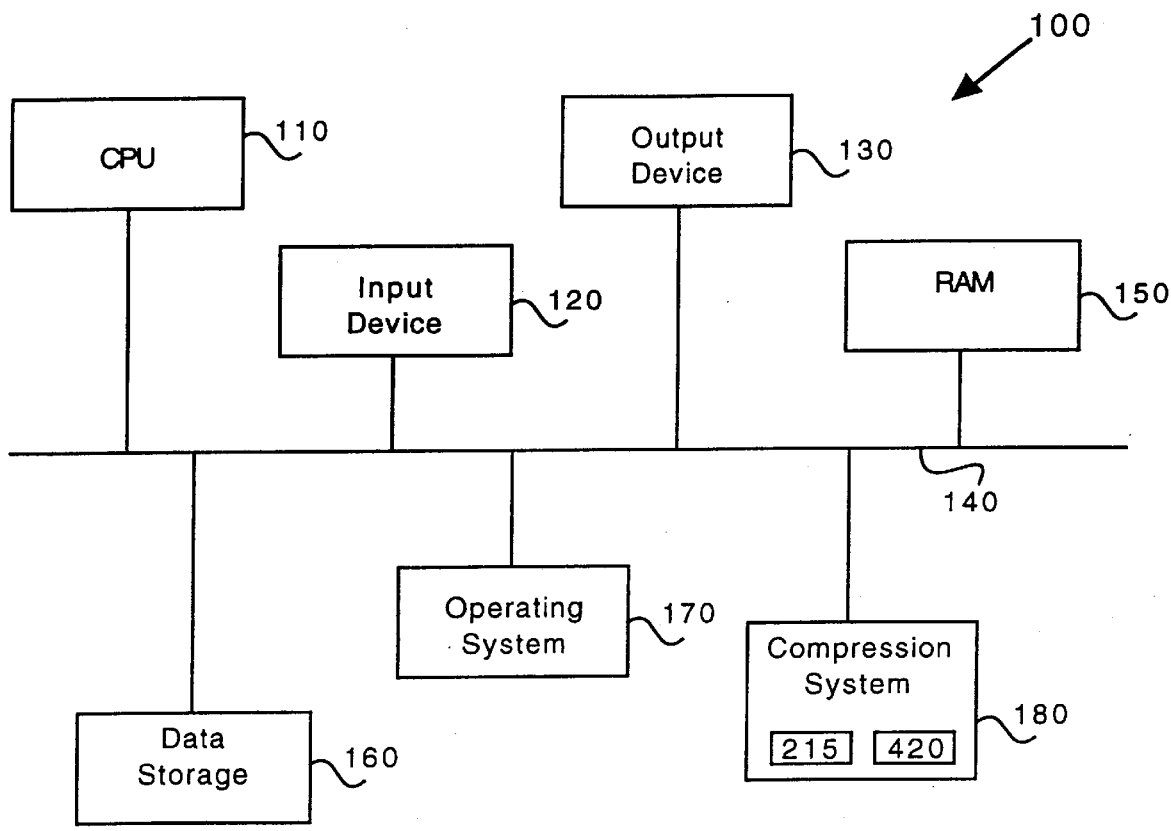
FIG. 1 is a block diagram of a computer system including a compression system in accordance with the present invention.

FIG. 1 is a block diagram of a computer system 100 including a compression system 180 in accordance with the present invention. Computer system 100 is preferably based on a computer such as a Power Macintosh manufactured by Apple Computer, Inc. of Cupertino, Calif. Computer system 100 includes a Central Processing Unit (CPU) 110, an input device 120 such as a keyboard and mouse or scanner, and an output device 130 such as a Cathode Ray Tube (CRT) or audio speaker, a Random Access Memory (RAM) 150, a data storage (hard disk) 160, an operating system 170 and a compression system 180, each coupled to signal bus 140.

Operating system 170 is a program that controls processing by CPU 110, and is typically stored in data storage 160 and loaded into RAM 150 during computer system initialization. CPU 110 has access to RAM 150 for storing intermediate results and miscellaneous data.

Compression system 180 includes a dictionary compressing program 215 for compressing a pronunciation dictionary, and a decoder system program 420 for subsequently processing text and using the compressed pronunciation dictionary to retrieve phonemes representing the pronunciation of the text. Compression system 180 is also typically stored in data storage 160 and loaded into RAM 150 prior to execution by CPU 110.

Figure 2:
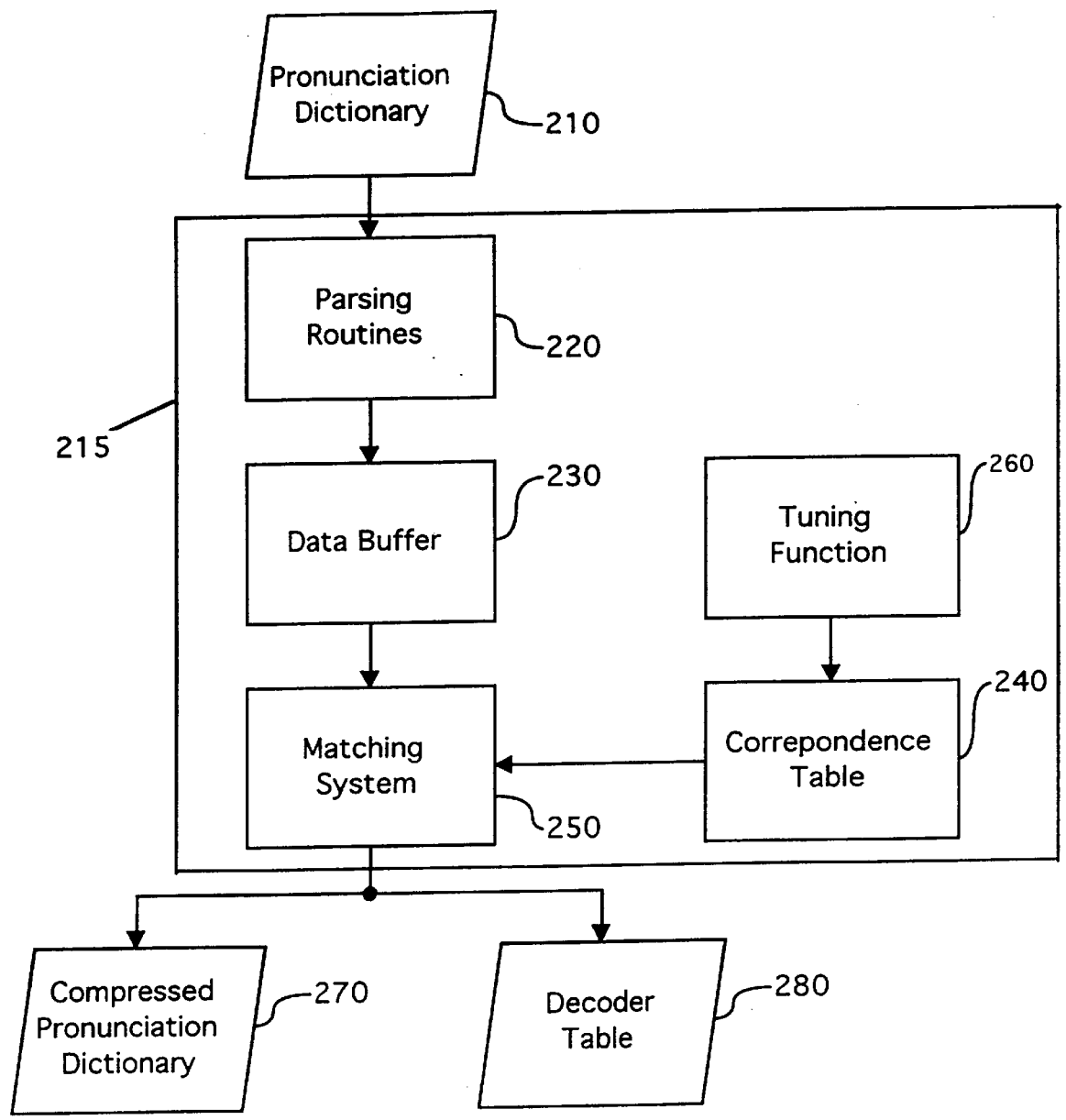
FIG. 2 is a block diagram showing dictionary compressing components of the FIG. 1 compression system used to construct a compressed pronunciation dictionary.

FIG. 2 is a block diagram illustrating dictionary compressing program 215 of compression system 180, used with a pronunciation dictionary 210 to construct a compressed pronunciation dictionary 270. Pronunciation dictionary 210 is preferably a conventional compilation of dictionary words and of corresponding dictionary phonemes in a specified format expressing proper pronunciation of the dictionary words in, for example, American English. Suitable pronunciation dictionaries include the Oxford-American® Dictionary or the Random House® Dictionary. FIG. 7 illustrates an example phoneme list 700 for American English. List 700 includes thirty-eight phonemes and an example word which uses each phoneme. For example, the phoneme "AE", provides the sound made by the letter "a", as in the word "bat.", Other phonemes or sound-representative symbols can alternatively be used.

Dictionary compressing program 215 includes parsing routines 220, a data buffer 230, a correspondence table 240, a matching system 250 and a tuning function 260. Parsing routines 220 extract a dictionary entry, which includes a dictionary word and at least one dictionary phoneme representing the pronunciation of the word, from pronunciation dictionary 210. For the example word "enough", the extracted dictionary entry includes the dictionary word "enough", and the corresponding phonemes "IH n UX f". Parsing routines 220 store the extracted dictionary entry in data buffer 230, which may be a portion of RAM 150 (FIG. 1).

Correspondence table 240 lists phoneme entries and text entries, for example, as shown for American English in FIG. 3. A text entry, a phoneme entry and a symbol together form a correspondence set, and a plurality of correspondence sets forms correspondence table 240. Each correspondence set includes an identifier, referred to as a correspondence symbol, which may be simply the address of the set in correspondence table 240.

Correspondence table 240 preferably includes correspondence sets for most practical combinations of correspondence text and phonemes in a given language. A correspondence table 240 which included every conceivable correspondence set would be inefficient because increasing the number of code sets degrades compression by subsequent compression techniques. Therefore, a tuning function 260 facilitates eliminating the less useful correspondence sets from, and adding more useful correspondence sets to, correspondence table 240. The utility or productivity of a correspondence set is determined by the number of dictionary entries it helps to compress. A pronunciation dictionary may be compressed a first time, and the compressed dictionary examined to determine if any correspondence sets are used less than, say, five times. If so, the less used and thus unproductive correspondence sets can be eliminated or modified. Further, since phonemes typically have corresponding text, cases where a phoneme does not match any text may indicate a need to add a correspondence set.

Matching system 250 is a program which reads the extracted dictionary entry from buffer 230, retrieves correspondence sets from correspondence table 240, and compares the dictionary entry with the correspondence sets. More particularly, matching system 250 attempts to match the correspondence sets with combinations of phonemes and characters from the dictionary entry. If matches are made, matching system 250 assigns the correspondence symbol associated with the "best", matching correspondence set as a compressed data entry, as described below with reference to FIG. 6. If a match cannot be made for a particular dictionary character or phoneme, matching system 250 assigns, as compressed data entries, special symbols to represent silent characters or unmatched phonemes. The one or more compressed data entries representing an entire dictionary entry forms a "symbol set.", The symbol sets for an entire pronunciation dictionary collectively form the "compressed pronunciation dictionary" 270.

Matching system 250 further generates decoder code sets for de-compressing compressed pronunciation dictionary 270, and adds the code sets to a "decoder table" 280. Each decoder code set includes a decoder text entry, a corresponding decoder phoneme entry, and a decoder set-identifying symbol equivalent to a correspondence symbol of correspondence table 240. Decoder table 280 is like correspondence table 240 except that decoder table 280 also includes decoder sets for the silent text characters and the unmatched phonemes. The decoder sets are described in more detail with reference to FIGS. 4 and 5.

FIG. 3 shows an example correspondence table 240 for American English. The first column specifies correspondence phoneme entries, the second column specifies correspondence text entries, and the third column specifies correspondence symbols. A correspondence text entry specifies text characters such as "e" or "ou," and is accompanied by typically only one phonetic sound. A correspondence phoneme entry, such as "IH," is expressed in the format used by pronunciation dictionary 210, for representing the phonetic sound of each correspondence text entry. Since some text entries produce multiple sounds, a phoneme entry may represent multiple sounds such as "y UH." Further, there may be correspondence entries which have multiple text characters and multiple phonemes, like "y UW→ieu."

The correspondence sets may be organized into groups of rows of like phonemes. Grouping rows based on phonemes facilitates comparison with dictionary combinations if creating table 240 by hand. In the first row of table 240, correspondence phoneme "AE" represents one of the possible pronunciations of correspondence text entry "ai", and this correspondence set is represented by the symbol "(1)". In the second row, the same correspondence phoneme "AE" represents one of the possible pronunciations of a different correspondence text entry, "a", and this correspondence set is represented by the symbol "(2)". In the third row, correspondence phoneme "EY" represents another pronunciation of the same correspondence text entry "ai" in the first row, and this correspondence set is represented by symbol "(3)". These three rows illustrate how the same text entry may have different pronunciations, and different text entries may have the same pronunciation.

Correspondence table 240 may be generated manually, i.e. by typing the table into a computer file, or generated electronically, i.e. by computer analysis of productive phoneme-text combinations. It will be appreciated that each language, such as American English or French, would use a different correspondence table 240.

Figure 4:
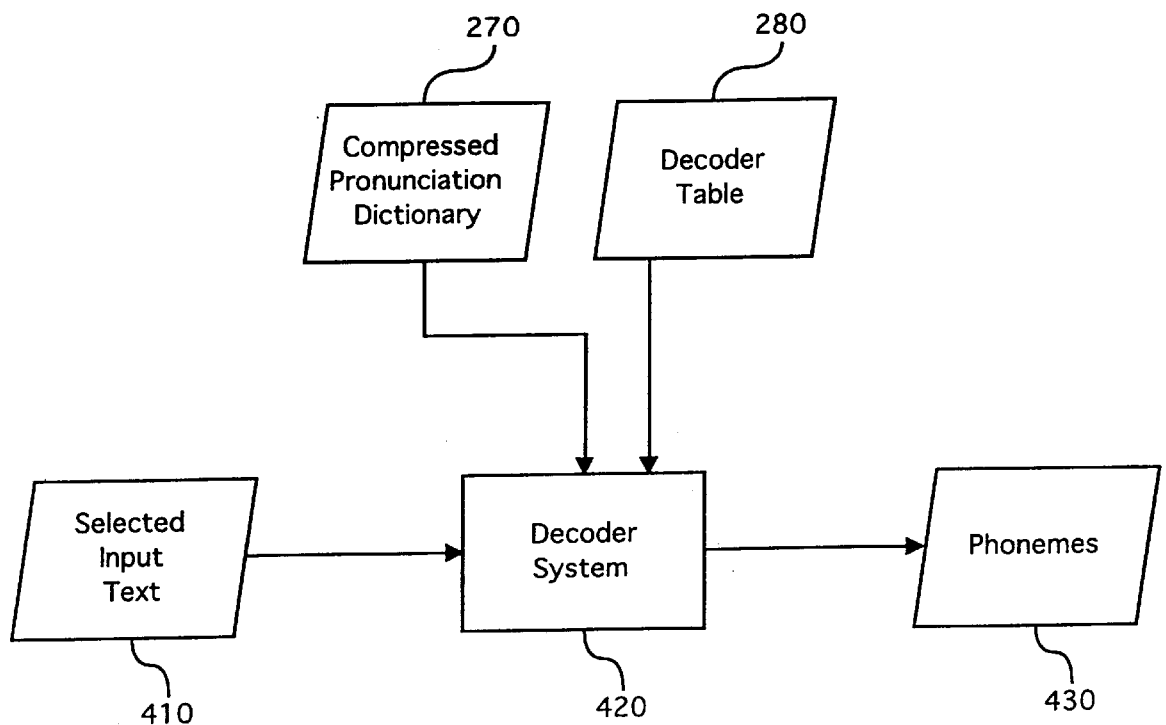
FIG. 4 is a block diagram showing components of the FIG. 1 compression system used in application of the compressed dictionary.

FIG. 4 is a block diagram illustrating the decoder system program 420 of compression system 180, and its input and output data. Selected input text 410 may be stored in data storage 160 and loaded into RAM 150 for examination. Decoder system program 420 receives a word from selected input text 410.

Decoder system 420 uses the decoder table 280 codes to translate symbol sets of compressed pronunciation dictionary 270 in searching for the compressed dictionary word whose text matches the received word, and then in producing phonemes for the received word. If the dictionary compressing method compressed pronunciation dictionary 210 entries in the original alphabetical order of the dictionary words, then the symbol sets are entered in the same alphabetical order in compressed pronunciation dictionary 270. Thus, decoder system 420 could approximate the location of the dictionary word which matches the input text word. Another embodiment of the dictionary compressing method provides an index to compressed pronunciation dictionary 270. Further, any technique for searching a compressed file, such as a hashing function, may be used.

Upon matching a compressed dictionary word to the input text word, decoder system 420 uses the decoder table 280 codes to retrieve dictionary phonemes 430 from the matching symbol set. Alternatively, as it searches the compressed dictionary and converts symbol sets to find a dictionary word which matches the received text, decoder system 420 may also convert the symbol sets to produce phonemes at the same time.

For example, decoder system 420 receives the word "enough" from selected text 410. Decoder system 420 uses decoder table 280 to decode symbol sets from compressed pronunciation dictionary 270 until decoding a symbol set to match the dictionary word "enough". Upon finding a match, decoder system 420 uses decoder table 280 to translate the symbol set into the output data phonemes "IH n UX f" representing the pronunciation of the received text.

Figure 5:
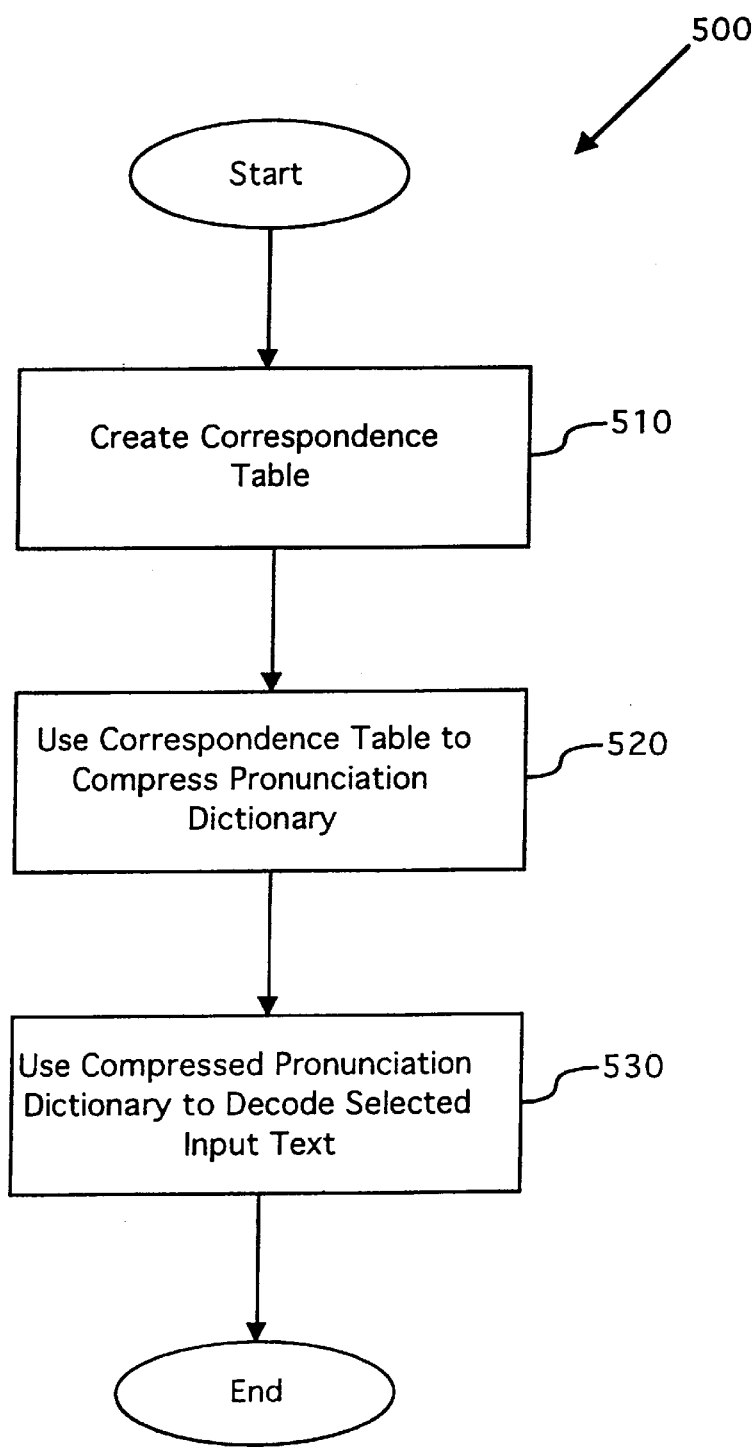
FIG. 5 is a flowchart illustrating the preferred method for compressing a pronunciation dictionary and using the compressed pronunciation dictionary for decoding selected text.

FIG. 5 is a flowchart illustrating a method 500 for compressing pronunciation dictionary 210 and for using the compressed dictionary to generate representative phonemes from selected input text 410. Method 500 begins in step 510 by creating a correspondence table 240 for a given language. Creating correspondence table 240 comprises the step of inputting a number of correspondence sets, each of which includes a phoneme entry expressing at least one phonetic sound and a text entry which indicates the phonetic sound or sounds, and inputting a correspondence set identifying symbol. Step 510 preferably includes inputting a correspondence set for each of the various text representations of all of the phonemes used in pronunciation dictionary 210.

The step 510 preferably further includes tuning function 260 (FIG. 2) using the current version of correspondence table 240 to compress at least a portion of pronunciation dictionary 210 for determining which correspondence sets are unproductive and what other correspondence sets may be valuable if added. Tuning function 260 may be re-applied to optimize correspondence table 240, thereby enabling matching system 250 to more effectively compress pronunciation dictionary 210 and enabling compressed pronunciation dictionary 270 to be further compressed by subsequent compression techniques.

Program 215 in step 520 uses the optimized correspondence table 240 to compress pronunciation dictionary 210. More particularly, parsing routines 220 extract a dictionary entry including a dictionary word and corresponding dictionary phonemes from pronunciation dictionary 210, and store the dictionary entry in data buffer 230.

Matching system 250 selects a first phoneme from the dictionary entry, and retrieves all correspondence sets from correspondence table 240 which start with the selected dictionary phoneme to determine if a match can be made. Multiple dictionary characters which together constitute a correspondence text entry in correspondence table 240 are "related." Divisions between related dictionary characters are typically harder to determine than divisions between dictionary phonemes. Also, there are fewer dictionary phonemes without corresponding dictionary characters (e.g., as in abbreviations such as "Mrs." or "etc.") than there are "silent" dictionary characters without phonemes. Therefore, matching system 250 preferably selects a dictionary phoneme, and attempts to match correspondence sets based on the dictionary phoneme.

Matching system 250 compares the correspondence sets retrieved from correspondence table 240 with the dictionary entry to determine if any matches can be made. If only one match is made, matching system 250 selects the correspondence symbol associated with the matching correspondence set as the compressed data entry for compressed pronunciation dictionary 270. If more than one match can be made, matching system 250 selects as the compressed data entry for compressed pronunciation dictionary 270 the symbol for the correspondence set corresponding to the best match. If no match can be made, matching system 250 generates special symbols to represent "silent" characters, or conversely generates special symbols to represent phonemes unmatched to dictionary text. Generation of special symbols is described in greater detail with reference to FIG. 6. If a special symbol is generated, a decoder code set representing the association of the special symbol to the silent character or alternatively to the unmatched phoneme is added to decoder table 280 for subsequently decoding the special symbol.

Matching system 250 then selects the next unprocessed phoneme, and repeats step 520 until the compressed data entries have been generated for the entire dictionary entry. Examples of this process are described with reference to Examples 1–3. After all the pronunciation dictionary 210 entries have been compressed, the symbol set, which possibly includes special symbols, is added to compressed pronunciation dictionary 270. It will be appreciated that step 510 and step 520 are typically performed by a product developer.

Decoder system 420 in step 530 uses compressed pronunciation dictionary 270 and decoder table 280 to generate phonemes for selected text 410. Decoder system 420 receives a selected word from text 410, and then uses decoder table 280 to decode symbol sets from compressed pronunciation dictionary 270 until one of the decoded dictionary words matches the first input word. Decoder system 420 next uses decoder table 280 to retrieve the dictionary phonemes from the matching symbol set, and then method 500 ends for the first input word. Step 530 repeats for subsequently received words. It will be appreciated that step 530 is typically performed by a customer.

Figure 6:
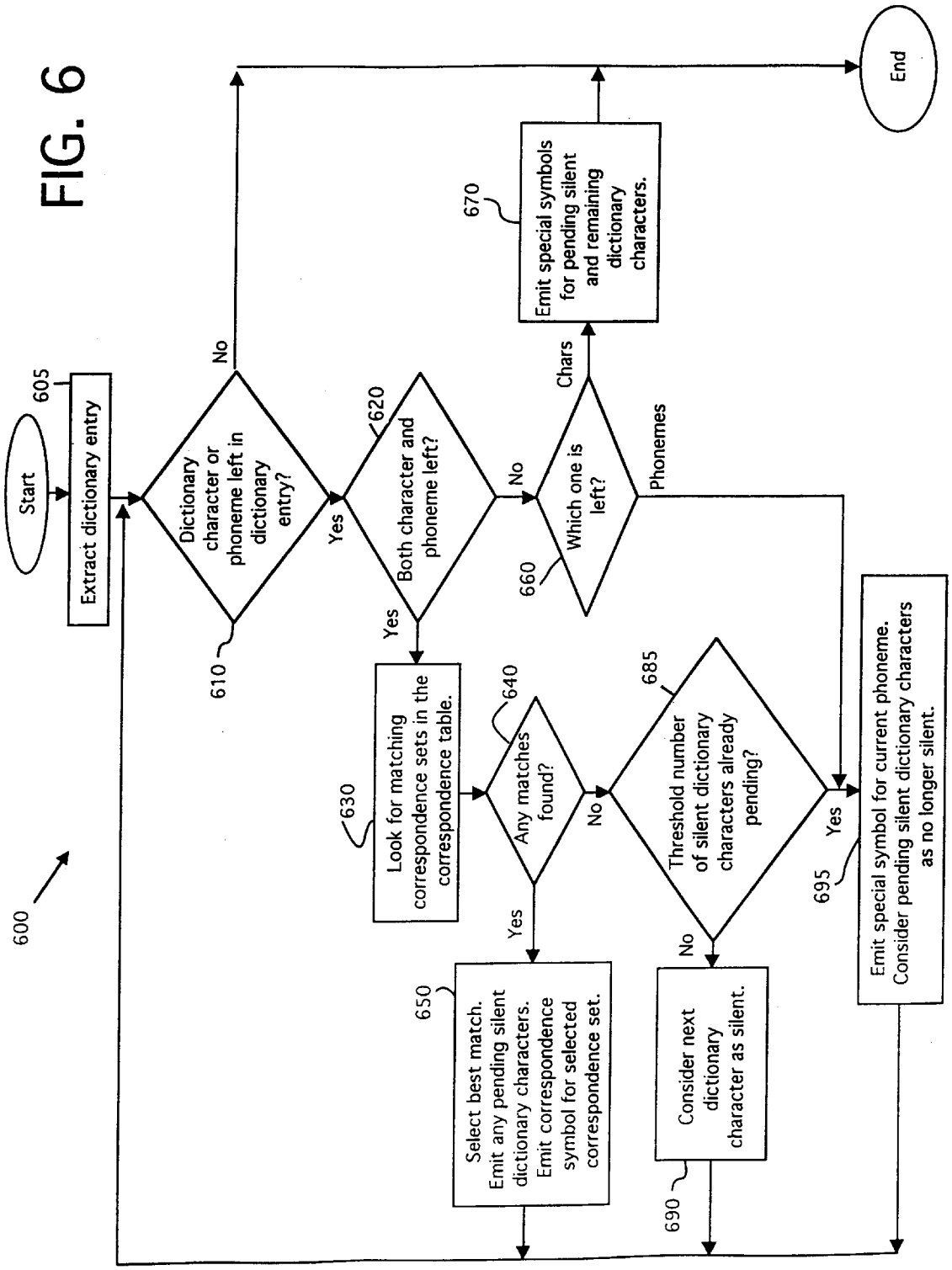
FIG. 6 is a flowchart further illustrating steps of the preferred method for compressing an entry from a pronunciation dictionary.

FIG. 6 is a flowchart illustrating a preferred method 600 for compressing an entry from pronunciation dictionary 210. Method 600 is repeated for every word in the dictionary to accomplish FIG. 5 step 520. Method 600 begins in step 605 by matching system 250 reading a dictionary entry, which comprises a dictionary word and a dictionary phoneme entry representing the pronunciation of the dictionary word, from buffer 230. Matching system 250 in step 610 determines whether any dictionary characters or dictionary phonemes remain unprocessed in the dictionary entry. If not, method 600 ends. Otherwise, matching system 250 in step 620 determines whether both a dictionary character and a dictionary phoneme remain.

If both remain, matching system 250 in step 630 searches correspondence table 240 for all correspondence sets that match dictionary phoneme-character combinations of the remaining portions of the dictionary entry. More particularly, selecting the next currently-unmatched phoneme, matching system 250 retrieves all correspondence sets which begin with the selected dictionary phoneme. Matching system 250 then compares these correspondence sets against the unmatched portions of the dictionary entry.

If matching system 250 in step 640 finds at least one match, then matching system 250 in step 650 selects the best match, assigns and stores symbols for any pending silent dictionary characters, and stores the correspondence symbol for the selected matching correspondence set. Method 600 then returns to step 610.

To select the best match, matching system 250 first selects from the matching sets as the tentative choice the correspondence set having the most phonemes. If there is more than one set having the most phonemes, then matching system 250 selects as the tentative choice the set that has the most phonemes and the most text characters. If there are more than one of these sets, matching system 250 just selects the first of them. The tentative choice is the best match unless matching system 250 determines one of the other sets satisfies selected criteria, suggesting that it is a better choice. The criteria include:

(1) the other correspondence set is shorter than the current tentative choice, i.e., it has fewer phonemes or has the same number of phonemes and fewer text characters;

(2) at least one unprocessed dictionary phoneme would remain in the dictionary entry after the non-tentative set is applied; and (3) there is a correspondence set that matches the next unprocessed dictionary phonemes and dictionary characters that would remain if the non-tentative set were to be applied.

If another set meets the above criteria, it becomes the tentative choice. The process repeats until all other sets have been tested. Method 600 then returns to step 610.

If in step 640 no matches are found, matching system 250 in step 685 determines whether a threshold number of dictionary characters are currently assumed silent. If not, matching system 250 in step 690 considers the next dictionary character as silent, and returns to step 610. If in step 685 a set threshold number of silent characters are pending, matching system 250 in step 695 assigns and stores a special symbol for the current phoneme and considers pending silent dictionary characters as no longer silent, i.e. re-labels the pending silent characters as unprocessed. Method 600 then returns to step 610.

If in step 620 matching system 250 determines that there are not both a dictionary character and a phoneme remaining in the dictionary entry, then matching system 250 in step 660 determines whether it is characters or phonemes that remain. If characters remain, matching system 250 in step 670 assigns and stores special symbols for all pending silent and all remaining dictionary characters. If only phonemes remain, system 250 proceeds to step 695 and continues as explained above.

EXAMPLE 1

"IH n UX f" and "enough"

Matching system 250 retrieves the dictionary word "enough" and the dictionary phonemes "IH n UX f" from data buffer 230. Matching system 250 then selects the first dictionary phoneme y"IH," retrieves from exemplary table 240 (FIG. 3) all correspondence sets which begin with the selected phoneme (IH→a, IH→e, IH→i, IH→o, IH→u, IH→y), and determines if any of the correspondence sets match.

*IH n UX f    enough*

Matching system 250 finds only one match (IH→e) and accordingly "remembers," i.e. stores in memory, the symbol "(43)" representing the match.

Matching system 250 then selects the next unprocessed phoneme "n" and retrieves the correspondence sets (ny→gn, n→en, n→gn, n→kn, n→nn, n→n).

*IH n UX f    e nough*

Matching system 250 finds only match (n→n), and remembers the symbol "(161)" representing the only match.

Matching system 250 selects the third phoneme "UX" and retrieves the correspondence sets (UXr→r, UX→a, UX→eu, UX→e, UX→i, UX→ou, UX→o, UX→u, UX→y).

*IH n UX f    en ough*

Matching system 250 finds two matches (UX→o and UX→ou), and selects the better match. Since UX→ou has more text characters matching system 250 selects it as the tentative best match. Matching system 250 applies the three-criteria test as described with reference to FIG. 6 to confirm the best match assumption. The other set UX→o has fewer text characters, and a phoneme remains after it is applied. However, a match cannot be made with the next currently unmatched phoneme "f" and remaining text characters "ugh." Thus, matching system 250 selects UX→ou as the best match, and accordingly remembers the correspondence symbol "(89)."

Matching system 250 selects the next unprocessed phoneme "f" and retrieves the correspondence sets (f→ff, f→f, f→gh, f→ph).

*IH n UX f    enou gh*

Matching system 250 finds only one match (f→gh) and thus remembers "123" as representing the match. Accordingly, matching system 250 stores the symbol set "43 161 89 123" in compressed pronunciation dictionary 170 as the compressed data entry representing the dictionary word "enough" and its dictionary phonemes "IH n UX f".

EXAMPLE 2

"AE n s UX r" and "answer"

Matching system 250 retrieves the dictionary word "answer" and the dictionary phonemes "AE n s UX r". In a manner similar to that described in Example 1, matching system 250 matches the dictionary combination AE→a and represents it by correspondence symbol "2," matches the dictionary combination n→n and represents it by symbol "161" and matches the dictionary combination s→s and represents it by symbol "173." At this time, matching system 250 selects dictionary phoneme "UX" and retrieves the correspondence sets (UXr→r, UX→a, UX→eu, UX→e, UX→i, UX→ou, UX→o, UX→u, UX→y).

$$AE\underset{\wedge}{n\ s\ UX}\underset{\wedge}{r}\quad ans\ wer$$

Matching system 250 finds no match. Thus, matching system 250 assumes that "w" is silent.

With the "w" silent, matching system 250 examines the correspondence sets with the remaining unprocessed dictionary entry.

$$AE\underset{\wedge}{n\ s\ UX}\underset{\wedge}{r}\quad answ\ er$$

Matching system 250 finds a match (UX→e), and thus assigns and stores a special symbol such as "221" to represent the silent dictionary character "w" and remembers the symbol "(87)." Further, matching system 250 adds the decoder code set, for example "221 w ø" wherein the empty set represents no phoneme, to decoder table 280.

Lastly, matching system 250 selects the dictionary phoneme "r" and retrieves the correspondence sets (r→rr, r→er, rr→r, r→r).

$$AE\underset{\wedge}{n\ s\ UX}\underset{\wedge}{r}\quad answe\ r$$

Matching system 250 finds only one match (r→r), and selects the symbol "(155)." Matching system 250 adds "2 161 173 221 87 155" to compressed pronunciation dictionary 270 as a symbol set representing the word "answer" and the phonemes "AE n s UX r."

EXAMPLE 3
"r IH D AX m" and "rhythm"

Matching system 250 retrieves the dictionary word "rhythm" and the dictionary phonemes "r IH D AX m," selects the first dictionary phoneme "r" and retrieves the correspondence sets (r→rr, r→er, rr→r, r→r).

$$\underset{\wedge}{r}\ IH\ D\ AX\ \underset{\wedge}{m}\quad rhythm$$

Matching system 250 finds only one match (r→r), and remembers the symbol "169."

Matching system 250 selects the next unprocessed phoneme "IH" and retrieves the correspondence sets (IH→a, IH→e, IH→i, IH→o, IH→u, IH→y).

$$\underset{\wedge}{r}\ IH\ D\ AX\ m\quad \underset{\wedge}{r}hythm$$

Matching system 250 finds no matches. Accordingly, matching system 250 assumes the "h" is silent. With the "h" silent, matching system 250 then examines the remaining portions of the dictionary entry.

$$\underset{\wedge}{r}\ IH\ D\ AX\ m\quad rh\ ythm$$

Matching system 250 finds a match (IH→y), assigns a special symbol such as "222" for silent "h" and remembers the symbol "47."

Matching system 250 then selects the next unprocess phoneme "D" and retrieves only correspondence set (D→th), since in this example matching system 250 is case sensitive.

$$\underset{\wedge}{r}\ IH\ D\ AX\ m\quad \underset{\wedge}{rhy}\ thm$$

Matching system 250 finds a match and remembers the symbol "120."

Matching system 250 then selects the next unprocessed phoneme "AX" and retrieves the correspondence sets (AXk→c, AXl→l, AXm→m, AX→a, AX→e, AX→ia, AX→i, AX→o, AX→u, AX→y, AX→').

$$\underset{\wedge}{r}\ IH\ D\ AX\ m\quad \underset{\wedge}{rhyth}\ m$$

Matching system 250 finds only one match (AXm→m), and remembers symbol "(16)." Since no other characters exist, matching system 250 adds "169 222 47 120 16" to compressed pronunciation dictionary 270 as a symbol set representing the dictionary word "rhythm" and the corresponding phonemes "r IH D AX m."

If for example the correspondence set AXm→m was not included in correspondence table 240, matching system 250 would find no match. Accordingly, matching system 250 would assume the text character "m" is silent. Since only characters would remain, matching system 250 would emit a special symbol such as "223" for current phoneme "AX" and would consider the text character "m" is no longer silent. Matching system 250 would then retrieve the correspondence sets (m→lm, m→mm, m→m) for phoneme "m" would find the only match m→m, and would remember the symbol "155." Since no other characters would exist, matching system 250 would add "169 222 47 120 223 155" to compressed pronunciation dictionary 270 as a symbol set representing the dictionary word "rhythm" and the corresponding phonemes "r IH D AX m."

The present invention advantageously provides a system and method for compressing a pronunciation dictionary. This is especially useful, for example, as a precursor to other compression techniques. The system and method take advantage of the natural redundancy between dictionary text and dictionary phonemes. Since compression system 180 substitutes symbols for sets of dictionary words and phonemes, memory required to store the information is reduced by approximately one-third to one-half.

For example, each character in a word may be represented by five bits (since there are twenty-six letters in the English alphabet), and each phoneme may be represented by six bits (since there are about thirty-nine phonemes for American English as illustrated in FIG. 7). Further, dictionary words and the set of phonemes for each dictionary word are divided by a terminator character. The word "enough" requires seven characters (including the terminator character) and thus occupies thirty-five bits. The corresponding phoneme set "IH n UX f" requires five characters (including the terminator character), and thus occupies thirty bits. Thus, the total memory for storing this dictionary entry is sixty-five bits.

A decoder table 280, as shown in FIG. 3, has about 220 correspondence sets and 220 correspondence symbols. Accordingly, eight bits are needed to represent a correspondence symbol. As illustrated in the first example, the four symbols "(43)" "(161)" "(89)" and "(123)" represent the word "enough" and phonemes "IH n UX f". Thus, five symbols (including the terminator character) are needed and occupy forty bits. Forty bits provides a thirty-eight percent savings over the uncompressed sixty-five bits.

The foregoing description of the preferred embodiments of the invention is by way of example only, and other variations are provided by the present invention. For example, components of this invention may be implemented using a programmed general purpose digital computer, using application specific integrated circuits, or using a network of interconnected conventional components and circuits. Further, although the invention has been described with reference to a dictionary, any guide having text and phonemes can be compressed using the system and method of the present invention. Still further, although the invention has been described using phonemes, other alternative means for representing pronunciation of text are possible, such as allophones, syllables or symbols generated by an earlier compression system. The embodiments described herein are presented for purposes of illustration and are not intended to be exhaustive or limiting. Many variations and modifications are possible in light of the foregoing teaching. The system is limited only by the following claims.

What is claimed is:

1. A system for compressing a pronunciation guide which includes a plurality of guide entries, each entry having a guide word and at least one associated phoneme representing the pronunciation of the word, the system comprising:
    memory storing
        (1) a correspondence table which includes a plurality of correspondence sets, each set having
            (i) a text entry,
            (ii) a phoneme entry representing a pronunciation of the text entry, and
            (iii) a symbol identifying the correspondence set; and
        (2) a matching system for comparing a selected guide word and the associated phonemes with correspondence sets, and storing correspondence symbols which represent matching correspondence sets as a compressed pronunciation guide entry in the memory; and
    a processing unit coupled to the memory for controlling the operations of the matching system.

2. The system of claim 1 wherein the correspondence table includes correspondence sets for productive combinations of phonemes and text in a particular language.

3. The system of claim 1 wherein the correspondence symbols are numbers, each representing the position of the respective correspondence set in the correspondence table.

4. The system of claim 1 wherein the memory further stores a tuning function which enables deletion of unproductive correspondence sets from the correspondence table.

5. The system of claim 1 wherein the matching system compares various correspondence sets, and if several matches are made selects the best match.

6. The system of claim 1 wherein the matching system generates a special symbol representing a silent character, and stores the special symbol as part of a compressed pronunciation guide entry in the memory.

7. The system of claim 1 wherein the matching system generates a special symbol representing a phoneme without any corresponding characters, and stores the special symbol as part of a compressed pronunciation guide entry in the memory.

8. The system of claim 1 wherein the matching system generates a decoder table comprising decoder code sets for use in subsequently de-compressing compressed pronunciation guide entries.

9. The system of claim 8 wherein the decoder code sets replicate a portion of the correspondence table.

10. The system of claim 8 wherein the decoder code sets include symbols representing silent text.

11. The system of claim 8 wherein the decoder code sets include symbols representing phonemes without corresponding characters.

12. The system of claim 1 wherein the matching system selects correspondence sets from the correspondence table for comparison with characters and phonemes from the guide entry.

13. The system of claim 1 wherein the pronunciation guide includes a pronunciation dictionary.

14. A system for using a compressed pronunciation guide and decoder table to decode selected text, comprising:
    memory storing
        (1) a compressed pronunciation guide having a plurality of symbol sets, each symbol set representing a guide word and at least one corresponding guide phoneme representing the pronunciation of the guide word,
        (2) a decoder table having a plurality of decoder code sets for translating symbol sets, each decoder code set including a decoder text entry, a decoder phoneme entry and a decoder symbol representing the decoder code set;
        (3) a decoder system for using the decoder table to translate symbol sets to find a guide word which matches the selected text, and upon finding a match using the decoder table
    to retrieve the decoder phonemes from the matching symbol set; and
    a processor coupled to the memory for controlling the operations of the decoder system.

15. The system of claim 14 wherein the decoder code sets include symbols representing silent text.

16. The system of claim 14 wherein the decoder code sets include symbols representing phonemes without corresponding characters.

17. A computer-based method for compressing a pronunciation guide which includes a plurality of guide entries, each entry having a guide word and at least one associated guide phoneme representing the pronunciation of the guide word, comprising the steps of:
    providing a computer memory;
    storing in a first portion of the computer memory a correspondence table which includes a plurality of correspondence sets, each correspondence set including a correspondence text entry, a correspondence phoneme entry representing a pronunciation of the correspondence text entry and a unique correspondence symbol identifying the correspondence set;
    receiving a guide word and at least one guide phoneme representing the pronunciation of the guide word;
    comparing the guide word and guide phonemes with correspondence sets; and
    storing the correspondence symbols representing matching correspondence sets as compressed pronunciation guide entries in a second portion of the computer memory.

18. The method of claim 17 wherein the correspondence table includes correspondence sets for productive combinations of phonemes and text in a particular language.

19. The method of claim 17 wherein the correspondence symbol is a number representing the position of the correspondence set in the correspondence table.

20. The method of claim 17 further comprising, after the step of storing in a first portion and before the step of receiving, the step of deleting unproductive correspondence sets from the correspondence table.

21. The method of claim 17 wherein the step of comparing further comprises:

selecting a next currently-unmatched guide phoneme from the guide entry;

retrieving all correspondence sets from the correspondence table which begin with the selected guide phoneme; and comparing the retrieved correspondence sets with the remaining portions of the guide entry.

22. The method of claim 21 wherein the step of comparing further comprises examining several correspondence sets, and if multiple matches are made selecting the best match.

23. The method of claim 22 wherein the step of comparing further comprises, if a match is not made, generating a special symbol which represents a silent guide character, and storing the special symbol in the memory as part of a compressed pronunciation guide entry.

24. The method of claim 22 wherein the step of comparing further comprises, if a match is not made, generating a special symbol which represents a phoneme without any corresponding guide characters, and storing the special symbol in the memory as part of a compressed pronunciation guide entry.

25. The method of claim 17 and further comprising the step of generating a decoder table including decoder code sets for decompressing the compressed pronunciation guide entries.

26. The method of claim 25 wherein the decoder code sets replicate a portion of the correspondence table.

27. The method of claim 25 wherein the decoder code sets include symbols representing silent text.

28. The method of claim 25 wherein the decoder code sets include symbols representing phonemes without corresponding guide characters.

29. The method of claim 17 further comprising, after the step of storing in a second portion, the step of using the compressed pronunciation guide to generate phonemes representing the selected text.

30. A computer-based method for using a compressed pronunciation guide and a decoder table to retrieve phonemes for selected text, comprising the steps of:

providing computer memory;

storing in a first portion of the computer memory a compressed pronunciation guide which includes a plurality of symbol sets, each symbol set representing a guide word and at least one guide phoneme representing the pronunciation of the guide word;

storing in a second portion of the computer memory a decoder table which includes a plurality of decoder sets, each decoder set having a decoder text entry, a decoder phoneme entry representing the pronunciation of the decoder text entry, and a unique decoder set identifying symbol;

receiving selected text;

using the decoder table to decode a symbol set in the pronunciation guide to produce a guide word;

comparing the selected text with the guide word to determine if they match; and if a match is made, using the decoder table to retrieve the guide phonemes corresponding to a matching symbol set.

31. A computer storage medium storing a computer program for causing a computer to perform the steps of:

allocating computer memory;

storing in a first portion of the computer memory a compressed pronunciation guide which includes a plurality of symbol sets, each symbol set representing a guide word and guide phonemes representing the pronunciation of the guide word;

storing in a second portion of the computer memory a decoder table which includes a plurality of decoder sets, each decoder set having a decoder text entry, a decoder phoneme entry representing the pronunciation of the decoder text entry, and a unique decoder set identifying symbol;

receiving selected text;

using the decoder table to decode a symbol set in the pronunciation guide to produce a guide word;

comparing the selected text with the guide word to determine if they match; and if a match is made, using the decoder table to retrieve the guide phonemes corresponding to a matching symbol set.

32. A computer storage medium storing a computer program for causing a computer to perform the steps of:

allocating computer memory;

storing in a first portion of the computer memory a correspondence table which includes a plurality of correspondence sets, each correspondence set including a correspondence text entry, a correspondence phoneme entry representing the pronunciation of the correspondence text entry and a unique correspondence symbol identifying each correspondence set;

receiving a guide word and at least one guide phoneme representing the pronunciation of the guide word;

comparing the guide word and guide phonemes with correspondence sets; and storing the correspondence symbols representing matching correspondence sets as compressed pronunciation guide entries, in a second portion of the computer memory.

33. A computer-based system for compressing a pronunciation guide, which includes a guide word and at least one guide phoneme representing the pronunciation of the guide word, comprising:

computer memory;

means for storing in a first portion of the computer memory a correspondence table which includes a plurality of correspondence sets, each correspondence set including a correspondence text entry, a correspondence phoneme entry representing the pronunciation of the correspondence text entry, and a unique correspondence symbol identifying the correspondence set;

means for receiving a guide word and at least one guide phoneme representing the pronunciation of the guide word;

means for comparing the guide word and guide phonemes with correspondence sets; and means for storing the correspondence symbols representing matching correspondence sets as a compressed pronunciation guide entry in a second portion of the computer memory.

* * * * *